(12) United States Patent
Caresosa et al.

(10) Patent No.: US 7,262,659 B2
(45) Date of Patent: Aug. 28, 2007

(54) ADAPTABLE VOLTAGE CONTROL FOR A VARIABLE GAIN AMPLIFIER

(75) Inventors: Mario Caresosa, Rancho Santa Margarita, CA (US); Guangming Yin, Foothill Ranch, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 11/559,195

(22) Filed: Nov. 13, 2006

(65) Prior Publication Data
US 2007/0069817 A1  Mar. 29, 2007

Related U.S. Application Data

(63) Continuation of application No. 11/239,927, filed on Sep. 29, 2005, now Pat. No. 7,135,926, which is a continuation of application No. 10/852,275, filed on May 24, 2004, now Pat. No. 6,980,053.

(51) Int. Cl.
*H03F 3/45* (2006.01)

(52) U.S. Cl. .................................. 330/254; 330/278

(58) Field of Classification Search ............... 330/51, 330/129, 136, 254, 278, 279
See application file for complete search history.

(56) References Cited

U.S. PATENT DOCUMENTS

| 6,169,452 B1 * | 1/2001 | Popescu et al. ............. 330/254 |
| 6,297,698 B1 * | 10/2001 | Callahan, Jr. ............... 330/254 |
| 6,404,283 B1 * | 6/2002 | Lau et al. .................... 330/129 |

* cited by examiner

*Primary Examiner*—Henry Choe
(74) *Attorney, Agent, or Firm*—McAndrews, Held & Malloy, Ltd.

(57) ABSTRACT

A method and apparatus for adaptively controlling a variable gain amplifier (VGA). The operation of the VGA is separated into a low gain mode and a high gain mode and the mode in which the VGA is currently operating in is adaptively sensed. A threshold voltage is compared to a control voltage of the VGA; if the VGA is currently operating in the low gain mode and the control voltage is higher than the threshold voltage, the VGA is switched from the low gain mode to the high gain mode; and if the VGA is currently operating in the high gain mode and the control voltage is lower than the threshold voltage, the VGA is switched from the high gain mode to the low gain mode.

30 Claims, 4 Drawing Sheets

ADAPTABLE VOLTAGE CONTROL FOR A VARIABLE GAIN AMPLIFIER

CROSS-REFERENCE TO RELATED APPLICATIONS

This patent application is a continuation of U.S. patent application Ser. No. 11/239,927 (now U.S. Pat. No. 7,135,926) titled "ADAPTABLE VOLTAGE CONTROL FOR A VARIABLE GAIN AMPLIFIER" filed Sep. 29, 2005, which is a continuation of U.S. Pat. application Ser. No. 10/852,275 now U.S. Pat. No. 6,980,053, filed May 24, 2004; the entire contents of each of which is hereby expressly incorporated herein by reference.

FIELD OF THE INVENTION

This application is related to variable gain amplifier (VGA) circuits, and more particularly to an adaptable voltage control for a two-band VGA.

BACKGROUND OF THE INVENTION

In high speed (e.g., 10 giga bits per second (Gb/s)), high performance, serial communication receivers that require equalization, variable gain amplifiers (VGAs) are sometimes used on the front end of the topology. The VGA is used to either provide gain or attenuation depending on the amplitude of the input signal such that the VGA outputs a substantially constant amplitude signal. The ability to adjust the gain/attenuation of the VGA so that both a very large and very small input voltage swing range at the input to the receiver can be accommodated is desirable for 10 Gb/s serial data communication applications.

Depending on the application, there may be system requirements in which the minimum and maximum input swing range at the input to the receiver is very wide. Thus, it can be difficult to design a VGA block capable of covering this wide input dynamic range while still being robust to manufacturing process, power supply (VDD), and temperature variations (hereby designated as PVT). Similarly, it may be possible to design a VGA block capable of covering the entire input dynamic range but at the cost of loss of linearity, or distortion.

Therefore, there is a need for a voltage control circuit for controlling a VGA that accommodates substantially the entire input dynamic range when such dynamic range is very large.

SUMMARY OF THE INVENTION

In one embodiment, the present invention is directed to a method and circuit for adaptively controlling a VGA. The operation of the VGA is separated into a low gain mode and a high gain mode and the mode in which the VGA is currently operating in is adaptively sensed. A threshold voltage is compared to a control voltage of the VGA; if the VGA is currently operating in the low gain mode and the control voltage is higher than the threshold voltage, the VGA is switched from the low gain mode to the high gain mode; and if the VGA is currently operating in the high gain mode and the control voltage is lower than the threshold voltage, the VGA is switched from the high gain mode to the low gain mode.

In another embodiment, the present invention is directed to an apparatus for adaptively controlling a variable gain amplifier (VGA) having a low gain mode of operation and a high gain mode of operation. The apparatus includes a circuit for adaptively sensing which mode the VGA is currently operating in; a comparator for comparing a threshold voltage to a control voltage of the VGA; and control logic for switching the VGA from the low gain mode to the high gain mode if the VGA is currently operating in the low gain mode and the control voltage is higher than the threshold voltage, and for switching the VGA from the high gain mode to the low gain mode if the VGA is currently operating in the high gain mode and the control voltage is lower than the threshold voltage.

DETAILED DESCRIPTION

In one embodiment, the present invention is a method and apparatus for adaptively adjusting a control voltage for a VGA having the capability of two different modes of operation or bands (that is, a high gain mode and a low gain mode). The invention includes means for adaptively sensing which of the bands (high gain or low gain) is needed, depending on what signal level is present at the input of the VGA. The method and apparatus of the present invention is capable of controlling the VGA switch from low gain mode to high gain mode when the control voltage substantially equals a first threshold voltage and controlling the VGA switch from high gain to low gain when the control voltage substantially equals a second threshold voltage.

Figure 1:
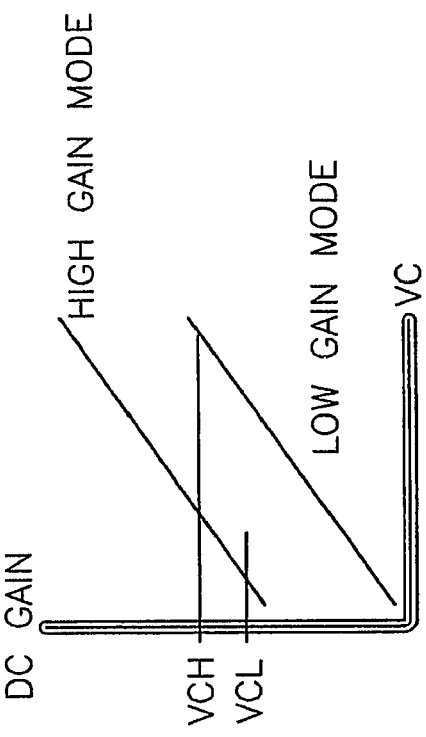
FIG. 1 is an exemplary plot illustrating the DC gain of the VGA on the vertical axis and the control voltage Vc on the horizontal axis.

FIG. 1 is an exemplary plot illustrating the DC gain of the VGA on the vertical axis and the control voltage Vc on the horizontal axis. As shown, the high gain mode is characterized by the threshold voltage $V_{CH}$, and the low gain mode is characterized by the threshold voltage $V_{CL}$. An adaptive control block of the present invention is capable of controlling the VGA switch from low gain mode to high gain mode when the control voltage Vc substantially equals $V_{CH}$, and switch from high gain to low gain when the control voltage Vc substantially equals $V_{CL}$. The adaptive control block is also capable of generating a $V_{CL}$ (the high gain to low gain Vc transition point) so that if this voltage is applied to a gate of a VGA degeneration block, the VGA degeneration block would have a resistance that is proportional to the resistance of the VGA load. If the resistance of the VGA degeneration block is proportional to the resistance of the VGA load, then the VGA gain would be independent of any process, power supply, and temperature variations, as described below with respect to FIG. 3.

Figure 2:
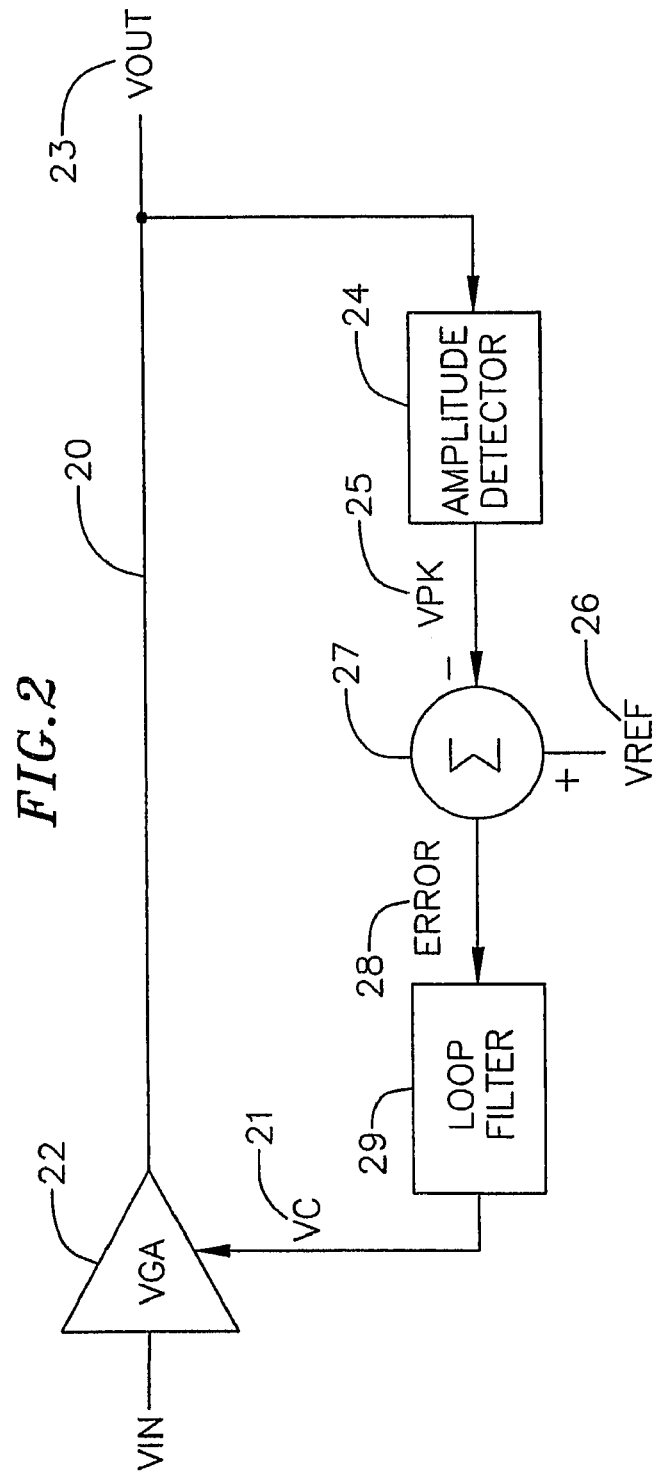
FIG. 2 is a block diagram of a generic automatic gain control (AGC)

Typically, a VGA is included inside a higher order block called the automatic gain control (AGC), as a sub-block. A block diagram of a generic AGC block 20 is shown in FIG. 2. Amplitude Detector 24 senses the output amplitude Vout 23 of the VGA 22 and generates a voltage that represents the peak voltage of the VGA output $V_{pk}$ 25. The Summer 27 compares the detected amplitude $V_{pk}$ 25 to a reference voltage $V_{ref}$ 26. The reference voltage $V_{ref}$ 26 represents the desired output amplitude of the VGA. Based on the comparison, the Summer 27 generates an Error signal 28 and feeds it to an AGC loop filter 29. In other words, Summer 27 determines the difference between the peak voltage $V_{pk}$ 25 and the reference voltage $V_{ref}$ 26, and adaptively adjusts the control voltage Vc 21, such that the VGA 22 produces an output swing that is equal to a pre-determined and fixed amplitude required by subsequent circuit blocks.

Figure 3:
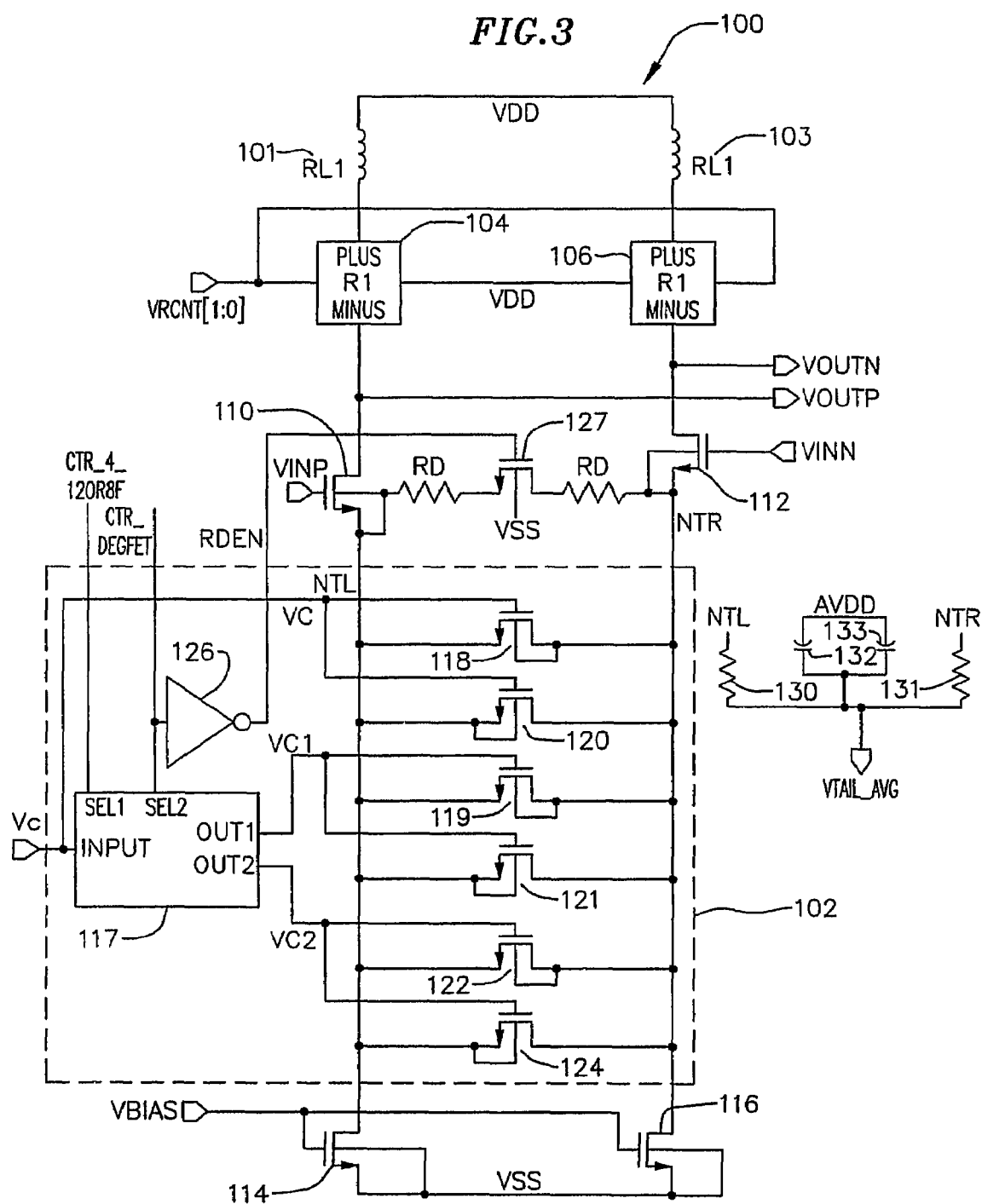
FIG. 3 is an exemplary VGA circuit, according to one embodiment of the present invention.

FIG. 3 shows an exemplary circuit diagram of a VGA having the capability of two different modes of operation. a VGA circuit 100 includes a gain control circuit 102 and a pair of process-compensated resistors 104, 106. The resistors 104 and 106 are coupled to a supply voltage VDD via shunt peaking inductors 101 and 103, respectively. The resistance of the resistors 104 and 106 are controlled by a control voltage input VRCNT[1:0].

The VGA circuit 100 also includes a differential pair of input transistors 110 and 112 that are coupled in series with the process-compensated resistors 104 and 106, respectively. A differential pair of voltage inputs Vinp and Vinn are coupled to gates of the input transistors 110 and 112, respectively, to generate a differential pair of outputs Voutn and Voutp, respectively. The input transistors 110 and 112 are NMOS transistors.

The sources of the input transistors 110 and 112 are coupled to drains of current source (NMOS) transistors 114 and 116, respectively, via the gain control circuit 102. The sources of the transistors 114 and 116 are coupled to a ground voltage VSS. Further, gates of the current source transistors 114 and 116 are coupled to a bias voltage VBIAS, which controls amount of the tail current in the VGA circuit 100.

Using the gain control circuit 102, the VGA circuit 100 can amplify or attenuate the input signals (i.e., Vinp and Vinn), such that a very large input swing range can be accommodated. The gain control circuit 102 includes three pairs of degeneration transistors, namely, NMOS transistors 118, 120 (a first pair), 119, 121 (a second pair), and 122, 124 (a third pair). The degeneration transistors 118, 120, 119, 121, 122 and 124 are coupled in parallel between the sources of the input transistors 110 and 112.

The degeneration transistors 118, 120, 119, 121, 122 and 124 are biased in the triode region, and are placed in parallel with the degeneration resistors $R_D$. The transistors (118, 120), (119, 121), and/or the transistors (122, 124) are sized to obtain the desired effective degeneration resistance $R_{DEFF}$. This parallel combination is used as the "variable resistor" which is the mechanism by which the gain of the VGA is changed. Thus, increasing the voltage applied to the transistors (118, 120), (119, 121), and/or the transistors (122, 124) results in increasing the DC gain of the VGA circuit 100. Conversely, decreasing the voltage applied to the transistors (118, 120), (119, 121), and/or the transistors (122, 124) results in decreasing the DC gain of the VGA circuit 100.

A transfer gate switch 117 is coupled between the control voltage Vc and the gates of the degeneration transistors 119, 121, 122 and 124. The transfer gate switch 117 couples the gates of the second and third pairs of degeneration transistors 119, 121, 122 and 124 between the control voltages Vc1 and Vc2 and the ground voltage VSS in response to two gain selection signals ctr_4_12or8f and ctr_degfet. Thus, the transfer gate switch 117 is able to change the operational mode between a "low gain mode," a "mid gain mode," and a "high gain mode" based on the gain selection signals ctr_4_12or8f and ctr_degfet.

The inverter 126 inverts the control signal ctr_degfet, turns on transistor 127 during the low gain mode and turns off transistor 127 during the high gain mode. During the low gain mode (ctr_degfet=0, RDEN=1), transistor 127 is turned on and the two degeneration resistors $R_D$ are placed in parallel to the degeneration transistors 118, 120, 119, 121, 122, and 124. This lowers the low gain mode enffective degeneration resistance $R_{DEFF}$, which effectively results in a higher gain. Thus, the "gain range" of the low gain mode is shifted higher slightly by the addition of the two degeneration resistors RD in parallel. Conversely, during the high gain mode (ctr_degfet=1, RDEN=0), the transistor 127 is turned off and the two degeneration resistors $R_D$ are not in parallel to the degeneration transistors. This increases the high gain mode effective degeneration resistance $R_{DEFF}$, which effectively results in a lower gain. So, the "gain range" of the high gain mode will be shifted slightly lower by the deletion of the two degeneration resistors $R_D$ from the parallel configuration.

In a low gain mode, Vc1 and Vc2 signals are both off (based on the gain selection signals ctr_4_12or8f and ctr_degfet), turning the degeneration transistor pairs (119, 121), and (122, 124) off, while the degeneration transistor pair (118, 120) is also turned on by the Vc voltage. In a high gain mode, Vc1 and Vc2 signals are both connected to the Vc voltage (based on the gain selection signals ctr_4_12or8f and ctr_degfet), which turns both the degeneration transistor pairs (119, 121), and (122, 124) on, while the degeneration transistor pair (118, 120) is turned on by the Vc voltage. In the mid gain mode, Vc2 is connected to ground and thus is turned off and Vc1 is connected to the Vc voltage (based on the gain selection signals ctr_4_12or8f and ctr_degfet). Thus, the degeneration transistor pair (119, 121) is turned on and (122, 124) is turned off, while the degeneration transistor pair (118, 120) is turned on. The mid gain mode is used in a manual operation of the VGA, as described below.

By way of example, when there is a very small signal swing at the input of the VGA (i.e., the input voltages Vinp and Vinn), then the high gain mode would be selected. The high gain mode configuration is when all six degeneration transistors 118, 120, 119, 121, 122 and 124 are connected to the control voltage Vc, where Vc=Vc1, and Vc=Vc2, respectively. Further, when a large signal swing is present at the input to the VGA, then the low gain mode is selected in response to the corresponding ctr_4_12or8f and ctr_degfet signals.

In the low gain mode configuration, only two degeneration transistors, namely, 118 and 120, are connected to the control voltage node Vc. The other four degeneration transistors are connected to VSS and thus are disabled.

Changing the analog voltage Vc applied to the gate node of the transistors pairs (118, 120), (119, 121), and/or (122, 124) will result in an effective change in resistance $R_{DEFF}$. This change in resistance $R_{DEFF}$ results in a change in the DC gain of the VGA cell. Hence, the VGA circuit provides the capability of varying the DC gain. In addition, the size (e.g., W/L) of the transistors may be adjusted during fabrication to change the DC gain of the VGA cell.

The gain ranges in the high gain mode and the low gain mode may overlap. For example, in one embodiment, the low gain range may be between −20 dB and +25 dB, while the high gain range may be between −20 dB and +38 dB. Even though the gain range for the low gain range is a subset of the gain range for the high gain range in this particular example, the VGA 100 may have poor THD (e.g., high distortion) near the low end of the gain range in the high gain mode, and therefore, the low gain mode may be used instead for low gain. For example, the high gain mode may have poor THD when the gain falls below approximately 9 dB. In other embodiments, the gain range of the low gain mode may not fall completely within the gain range of the high gain mode. In still other embodiments, the low gain mode or the high gain mode may begin to have poor THD at different gains within the respective gain ranges.

In summary, in the gain control circuit 102, two parallel transistors (i.e., degeneration transistors) 118 and 120 are used during the low gain mode, four parallel transistors 118, 120, 119 and 121 are used during the mid gain mode, and six parallel transistors 118, 120, 119, 121, 122 and 124 are used during the high gain mode.

Another element which influences the DC gain is the resistor load (i.e., resistors 104 and 106). Since the resistor load is not an ideal element, the value of resistance will typically vary significantly across process corners. This variation in resistance value may significantly impact the performance of the VGA circuit across process variations to the point at which a desired design parameter may no longer be met.

To address the process variations, the VGA circuit 100 of FIG. 3 includes the process-compensated resistors 104 and 106 instead of conventional resistors. The resistance across the resistors 104 and 106 can be varied by changing the digital CMOS voltages of the VRCNT[0:1] signal applied to the resistors 104 and 106, respectively. Hence, the process-compensated resistors 104 and 106 are used to minimize performance variations across process.

The voltage limits which determine when the VGA transitions between low gain to high gain and vice versa are now described. During the low gain to high gain transition (voltage threshold $v_{CH}$), the VGA is initially in the low gain mode and the input signal swing is small enough such that there is insufficient gain in this low gain mode to amplify the input so that the VGA output is large enough to meet the required swing.

In this low gain to high gain transition, the AGC loop will be constantly trying to increase the VGA control voltage Vc until it saturates to some voltage slightly below VDD. It is ideal to switch from the low gain to high gain mode at the highest possible gain setting, which occurs when the VGA control voltage Vc is set to it's maximum value. Because of the structure from which the VGA control voltage Vc is generated (typically from an output of an amplifier or comparator with a PMOS load), the maximum value of VGA control voltage Vc is slightly lower than the power supply VDD. If the low gain to high gain upper Vc transition point ($V_{CH}$) is set too high, PVT variations may create a situation where the Vc maximum may actually be lower than $V_{CH}$. Then in this situation, the AGC is not able to increase the Vc anymore, and the Vc value will be lower than $V_{CH}$, which therefore keeps the VGA in the low gain mode instead of transitioning into the desired high gain mode. Therefore, while in the low gain band, the ideal setting for the Vc voltage threshold to transition to the high gain mode should be a value that is slightly lower than the Vc maximum.

During the high gain to low gain transition (control voltage Vc lower limit), the VGA is first operating in the high gain mode and the input signal swing is large enough and there is an over-abundance of gain in the VGA such that the VGA output exceeds the output swing requirement. In this high gain to low gain transition, the AGC loop will be trying to decrease the VGA control voltage Vc until it saturates to some voltage above the ground voltage (GND).

However, for this particular application, it is ideal to switch from high gain to low gain at a certain gain level of the VGA as opposed to some voltage slightly above GND. The reason is if the high gain to low gain Vc transition point ($V_{CL}$) is set too low, non-linearity or distortion may start becoming an issue. Distortion starts becoming significant at lower Vc magnitudes, since the $V_{GS}$–$V_T$ of the degeneration resistors (transistor switches) approaches a negative value (i.e., $V_{GS}$ lower than threshold voltage $V_T$), which then indicates operation in the sub-threshold region. This implies a non-linear mode of operation for the transistor which may contribute to significant distortion. In addition, large amplitude signals at the input require lower gain at the VGA output. Thus, lower gain implies a higher degeneration resistance which is realized by lowering the control voltage Vc. In this situation, if the AGC decreases the Vc low enough that distortion starts to become an issue, the incoming data may be distorted to a point that it may degrade the receiver/equalizer performance.

Figure 4A:
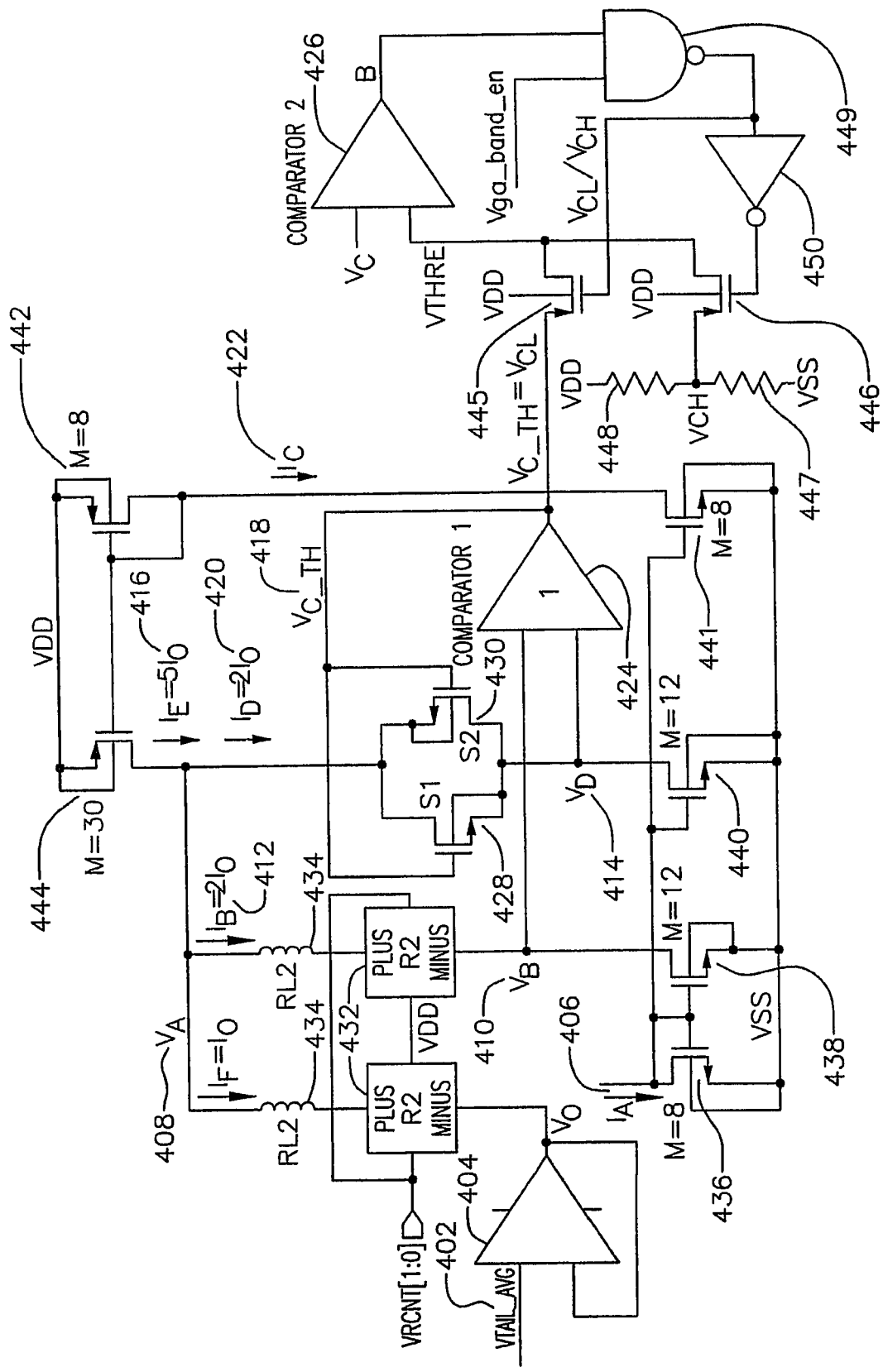
FIG. 4A is an exemplary circuit diagram for a first portion of a control block, according to one embodiment of the present invention.

FIG. 4A is an exemplary circuit diagram for a first portion of a control block, according to one embodiment of the present invention. The control block circuit adaptively switches from one mode (low gain) to another (high gain) and vice versa. Basically, the function of the control block is to first determine which band (low gain or high gain) the VGA cell is currently configured for. Then, the control block compares either $V_{CH}$ (if in low gain mode) or $V_{CL}$ (if in high gain mode) to the actual VGA control voltage Vc. In the case where the VGA is currently configured in the low gain mode, if the actual VGA Control voltage Vc is less than $V_{CH}$, then the control block does nothing and keeps the VGA configured in the low gain mode. If Vc is greater than $V_{CH}$, then the control block switches the VGA over to the high gain mode. Likewise, in the case where the VGA is currently configured in the high gain mode, if the actual VGA control voltage Vc is higher $V_{CL}$ then the control block does nothing and the VGA stays in the high gain mode. But if the Vc is lower than $V_{CH}$, then the control block switches the VGA over to the low gain mode. This is summarized in Table 1, which is described in more detail below.

A simple resistor divider (447 and 448 in FIG. 4A) between VDD and GND can be used to set the $V_{CH}$ since this threshold is defined as the point at which Vc attains its highest gain setting without running the risk of "not switching" across PVT variations. In other words, a Vc value that is large enough to maximize the gain while low enough such that PVT variations will still allow a switch over to the high gain band is sufficient.

Setting the $V_{CL}$ threshold, however, is a more complicated task. Because of distortion concerns at the "lower" Vc range of the high gain mode band, it is desired to switch over to the low gain mode just before the Vc approaches the region where the distortion starts to be unacceptable in the high gain mode band. That means that the setting of the $V_{CL}$ threshold should be at a Vc that represents some predetermined level of gain or amplification in the high gain mode band for all PVT variations. For example, ideally, the Vc value for the VGA (equal to the $V_{CL}$ threshold) for a slow manufacturing process should exhibit a similar gain as the Vc value (equal to the $V_{CL}$ threshold) for a fast manufacturing process.

Given that the slow and fast manufacturing processes are inherently different, it follows that the respective magnitudes of the $V_{CL}$ for the slow and the $V_{CL}$ for the fast manufacturing process will also be different. However, they should ideally result in a similar gain for the VGA. In other words, the $V_{CL}$ threshold should track or change along with the PVT variations such that the switch from high gain mode to low gain mode is made at a fixed gain for the VGA. This requires that the control block switch from high gain mode to low gain mode is made before distortion (present at the lower Vc range of the high gain mode band) becomes an issue.

Figure 4B:
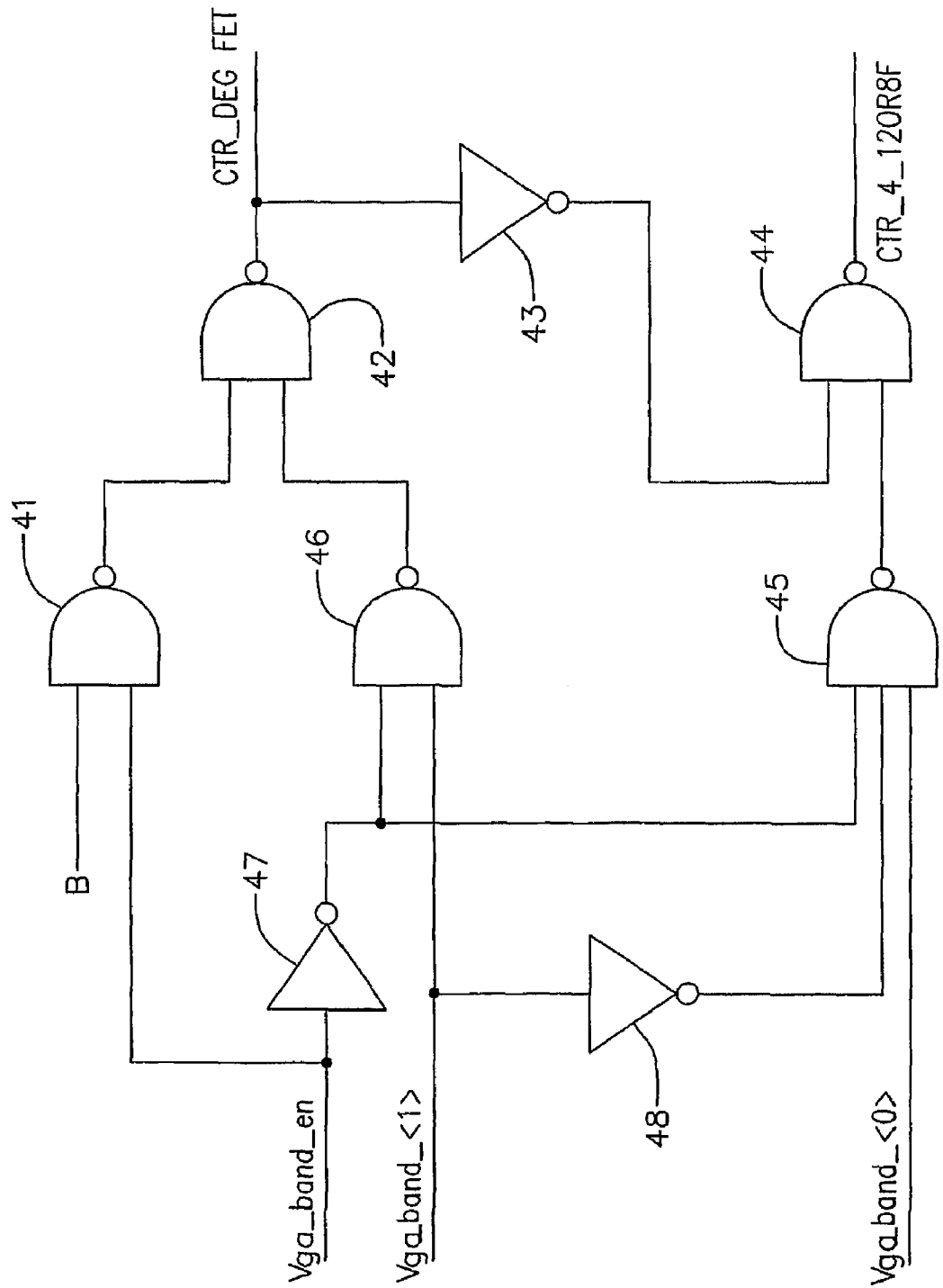
FIG. 4B is an exemplary circuit diagram for a second portion of a control block, according to one embodiment of the present invention.

Control signals ctr_4_12or8f and ctr_degfet, generated by the adaptive control block of FIGS. 4A and 4B, determine whether the VGA cell is in low gain mode, or high gain mode. The mid gain mode is only used in a manual operation (for example, testing and diagnostics), described below. The adaptive operation includes only the low gain mode and the high gain mode.

Referring back to FIG. 4A, the node voltage $V_{TAIL\_AVG}$ 402 represents the average voltage on each side of the degenerative switches inside the VGA cell in FIG. 3. This voltage is fed to the adaptive control block. Node $V_0$ is a unity gain buffered version of $V_{TAIL\_AVG}$, buffered by the buffer 404. The sizes of the current source transistors 436, 438, 440, 441, 442, and 444 are selected in such a way to obtain desired proportionality for the currents generated by the respective current sources. According to the selected sizes of the current source transistors 436, 438, 440, 441, 442, and 444, bias current $I_A$ 406 has a magnitude of 1.33×$I_0$. Current $I_c$ 422 is a 1:1 mirror of $I_A$ and thus has the same 1.33×$I_0$ current. Current $I_E$ 416 is a 30/8 (i.e., transistor 444 size/transistor 442 size) ratio or 3.75:1 mirror of current $I_c$ and has a magnitude of 5×$I_0$. Current $I_E$ is divided in the corresponding branches B, D, and F of $I_B$, $I_D$ and $I_F$, respectively. The respective currents of branch B and branch D are equal to each other and each has a value of 2×$I_0$. Finally, Branch F has a current of magnitude $I_0$. The voltage at node $V_A$ is shown in equation (1) below.

$$V_A = V_0 + I_0 R = V_0 + I_0(R_2 + R_{L2}) \text{ where } R = R_2 + R_{L2} \quad \text{Equation (1)}$$

Since branch current $I_B$ 412 equals branch current $I_D$ 420, the voltage on node $V_B$ 410 equals the voltage on node $V_D$ 414. The reason being, the comparator1 424 output $V_{C\_TH}$ adjusts the gate voltage of the switches $S_1$ (NMOS transistor 428) and $S_2$ (NMOS transistor 430) such that the effective switch resistance $R_{ON2}$ of the two switches $S_1$ and $S_2$ (when they are turned on) equals the effective resistance of the sum of resistor $R_2$ 432 and the parasitic resistance of the inductor $R_{L2}$ 434. Since $I_B$ equals $I_D$, and $R_{ON2}$ equals $R_2+R_{L2}$, it follows that $V_B$ equals $V_D$. The voltage at node $V_B$ and $V_D$ is shown in equation (2) below.

$$V_B = V_D = V_A - 2I_0 R \quad \text{Equation (2)}$$
$$= V_0 + I_0 R - 2I_0 R$$
$$= V_0 - I_0 R = V_0 - I_0(R_2 + R_{L2})$$
$$= V_0 - I_0(R_2 + R_{L2})$$

As described above, the goal of selecting the $V_{CL}$ threshold is to switch from high gain mode to low gain mode at a specific VGA gain level. In FIG. 4A, the $V_{CL}$ threshold is represented by comparator1 424 output voltage $V_{C\_TH}$ 418. The following equations detail how this adaptive control block is able to determine the $V_{CL}$ threshold. The equation for drain current $I_D$ of an NMOS transistor is shown in equation (3) below, for "small" values of $V_{DS}$.

$$I_D = u_n C_{OX} W/L(V_{GS} - V_T)V_{DS} \quad \text{Equation (3)}$$
$$= kx(V_{GS} - V_T)V_{DS}$$
(where $k = u_n C_{OX}$ and $x = W/L$)

The transimpedence $g_{ds}$ equation is:

$$g_{ds} = kx(V_{GS} - V_T) \quad \text{Equation (4)}$$

Thus $R_{ON}$ is the inverse of the transimpedence and is:

$$R_{ON} = 1/g_{ds} = 1/[kx(V_{GS} - V_T)] \quad \text{Equation (5)}$$

The DC gain equation for the VGA cell of FIG. 3 is shown in equation (6):

$$A = g_m R/[1+g_m R_D], \quad \text{Equation (6a)}$$

Assuming $g_m$ is very large, the above equation reduces to $$A = R/R_D \quad \text{Equation (6b)}$$
$$= (R_1 + R_{L1})/R_{ON1}$$

where $R=R_1+R_{L1}$, $R_{ON1}$, is the total effective degeneration switch resistance, and R1, and $R_{L1}$ are the respective load resistances of the VGA circuit of FIG. 3.

Substituting equation (5) in equation (6b) and recognizing that $V_{GS}=V_G-V_s$ and $V_G=V_c$ and $V_s=(V_0+aI(R_1+R_{L1})$ equation (6b) becomes:

$$A=(R_1+R_{L1})[kx(V_{GS}-V_T)] \quad \text{Equation (7)}$$
$$A=(R_1+R_{L1})kx[V_c-(V_0+aI(R_1+R_{L1}))-V_T]$$

where "a" is a proportionality constant.

Referring back to the adaptive control block, the switch $R_{ON2}$ equation becomes:

$$R_{ON2} = 1/[kx(V_{GS} - V_T)] \quad \text{Equation (8)}$$
where $V_G = V_{C\_TH}$ and $V_S = V_A$
$$= V_0 + I_0(R_2 + R_{L2})$$
$$= 1/[kx(V_{C\_TH} - (V_0 + I_0(R_2 + R_{L2})) - V_T -] = R_2 + R_{L2}$$

Solving for the comparator1 output voltage $V_{C\_TH}$ gives:

$$V_{C\_TH}=1/kx(R_2+R_{L2})+(V_0+I_0(R_2+R_{L2})+V_T] \quad \text{Equation (9)}$$

Now substituting equation (9) for Vc in equation (7) yields:

$$A=(R_1+R_{L1})kx[1/kx(R_2+R_{L2})+(V_0+I_0(R_2+R_{L2})+V_T]-V_0 aI(R_1+R_{L1})-V_T] \quad \text{Equation (10)}$$

This reduces to:

$$A=(R_1+R_{L1})/(R_2+R_{L2})+(R_1+R_{L1})kx[I_0(R_2+R_{L2})-aI(R_1+R_{L1})] \quad \text{Equation (11)}$$

Thus, equation (11) shows that if one were to select the product $I_0(R_2+R_{L2})$ to equal the product $aI(R_1+R_{L1})$, then the gain A reduces to a constant $(R_1+R_{L1})/(R_2+R_{L2})$. Therefore, one can select the desired gain at which to switch from high gain mode to low gain mode by choosing the appropriate resistance ratio. In addition, because the elements that comprise the adaptive control block are made up of the same elements in the VGA block of FIG. 3, PVT variations are accounted for. The $V_{CL}$ threshold voltage is then set to be the comparator1 output voltage $V_{C\_TH}$. This provides a $V_{CL}$ threshold voltage that is independent of PVT variations.

$V_{CH}$ is generated by the two divider resistors 447 and 448. The two PFET switches 445 and 446, controlled by the $V_{CL}/V_{CH}$ signal generated from NAND gate 449 and inverter 450, select either $V_{CL}$ or $V_{CH}$ to be input to the Comparator2 426. The output "b" of the comparator 2 determines what mode in the adaptive operation (i.e., a low gain mode or a high gain mode) the VGA is operating in. In this example, a "0" level for "b" indicate the low gain mode, and a "1" level for "b" indicate the high gain mode.

Table 1 below shows the Band Switching Truth Table, when adaptive control block is enabled (i.e., vga_band_en=1)

TABLE 1

| Band (b) | $V_C$ | b_next_state |
|---|---|---|
| Low gain (0) | $<V_{CH}$ | 0 |
| 0 | $>V_{CH}$ | 1 |
| High gain (1) | $<V_{c\_th}$ | 0 |
| 1 | $>V_{c\_th}$ | 1 |

FIG. 4B is an exemplary logic for a second portion of a control block, implementing the truth table of Table 2, described below. The digital logic comprising of NAND gates and Invertors, and comparator2 determine which band the VGA is currently configured for (low gain mode or high gain mode), then selects which threshold ($V_{CL}$ or $V_{CH}$) to send to comparator2 to compare against the VGA control voltage Vc. Signal vga_band_en when set to logic "1", enables, the adaptive control block. When vga_band_en is set to logic "0", the adaptive control block is disabled and changed to a manual operation mode, which allows the user to manually set the VGA to either low gain mode, mid gain mode, or high gain mode. The truth table for band switching is shown in table 2 below:

TABLE 2

|  | vga_band_en | vga_band <1:0> | b | ctr_degfet | ctr_4_12or8f |
|---|---|---|---|---|---|
| Manual Settings | 0 | 0  0 | X | 0 | 0 |
|  | 0 | 0  0 | 1 | X | 0 | 1 |
|  | 0 | 1  X | X | 1 | 1 |
| Adaptive Settings | 1 | X  X | 0 | 0 | 0 |
|  | 1 | X  X | 1 | 1 | 1 |

As shown in FIG. 4B and Table 2, in the manual mode (i.e., when vga_band_en is a logic "0"), the output of the gate 41 is "1", no matter what the logic level of the signal "b" is. When vga_band <1> is "0", the output of gate 46 is "1" and thus the output of gate 42, that is ctr_degfet, is also "0". At the same time, if vga_band <0> is "0" (i.e., the first row of Table 2), the output of gate 45 is "1" and thus the output of gate 44, that is ctr_4_12or8f, is "0". If vga_band <0> is "1" (when vga_band <1> is "0", i.e., the second row of Table 2), the output of gate 45 is "0" and thus the output of gate 44, that is ctr_4_12or8f, is "1". Similar description of the operation of the NAND gates of FIG. 4B applies to the remaining rows of Table 2.

In the adaptive operation (i.e., when vga_band_en is a logic "1"), Table 2 reduces to the truth table of Table 1, that is, the logic level of signal "b" becomes independent of the logic levels of the vga band <1:0> signals. Control signals ctr_4_12or8f and ctr_degfet are fed to the transfer gate switch 117 of the VGA of FIG. 3 to select the right amount of degeneration resistance to switch the VGA to one of the two adaptive modes of operation.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. One or more circuits for controlling a variable gain amplifier (VGA) operable in a low gain mode and a high gain mode, wherein a level of gain when operating in one of the low gain mode and high gain mode is adjustable according to a control signal, the one or more circuits comprising:
   interface circuitry for sensing the operating mode of the variable gain amplifier; and
   a controller operably coupled to the interface circuitry, the controller operable to, at least, determine the current operating mode of the variable gain amplifier;
      if the current operating mode is the low gain mode, compare the control signal to a first threshold representing a relatively higher level of gain, and set a new operating mode of the variable gain amplifier to the high gain mode, if a level of gain represented by the control signal is greater than the level of gain represented by the first threshold;
      if the current operating mode is the high gain mode, compare the control signal to a second threshold representing a relatively lower level of gain, and set the new operating mode of the variable gain amplifier to the low gain mode, if the level of gain represented by the control signal is less than the level of gain represented by the second threshold; and make the current operating mode of the variable gain amplifier equal to the new operating mode.

2. The one or more circuits according to claim 1, wherein the one or more circuits is operable in a manual or user controlled mode.

3. The one or more circuits according to claim 2, wherein the variable gain amplifier is operable in a mid gain mode.

4. The one or more circuits according to claim 1, wherein the second threshold represents a level of gain above which distortion is below a predetermined level.

5. The one or more circuits according to claim 1, wherein the second threshold represents a level of gain that is available independent of variations in device fabrication process, operating voltage, and operating temperature.

6. The one or more circuits according to claim 1, wherein the first threshold represents a level of gain slightly less than a maximum level of gain of the variable gain amplifier.

7. The one or more circuits according to claim 1, wherein the control signal comprises a voltage.

8. The one or more circuits according to claim 7, wherein a relatively more positive voltage results in a higher level of gain, and a relatively more negative voltage results in a lower level of gain.

9. The one or more circuits according to claim 1, wherein gain of the variable gain amplifier is determined by a variable resistance responsive to the operating mode.

10. An integrated circuit comprising:
a variable gain amplifier (VGA) operable in a low gain mode and a high gain mode, wherein a level of gain when operating in one of the low gain mode and high gain mode is responsive to a control signal;
comparator circuitry operable to compare the control signal to a first threshold representing a relatively higher level of gain and to a second threshold representing a relatively lower level of gain;
control logic operable to, at least,
determine a current operating mode of the variable gain amplifier;
change the operating mode of the variable gain amplifier to the high gain mode, if the current operating mode is the low gain mode and a level of gain represented by the control signal is greater than the level of gain represented by the first threshold; and
change the operating mode of the variable gain amplifier to be the low gain mode, if the current operating mode is the high gain mode and the level of gain represented by the control signal is less than the level of gain represented by the second threshold.

11. The integrated circuit according to claim 10, wherein the control logic is operable in a manual or user controlled mode.

12. The integrated circuit according to claim 11, wherein the variable gain amplifier is operable in a mid gain mode.

13. The integrated circuit according to claim 10, wherein the second threshold represents a level of gain above which distortion is below a predetermined level.

14. The integrated circuit according to claim 10, wherein the second threshold represents a level of gain that is available independent of variations in integrated circuit device fabrication process, operating voltage, and operating temperature.

15. The integrated circuit according to claim 10, wherein the first threshold represents a level of gain slightly less than a maximum gain of the variable gain amplifier.

16. The integrated circuit according to claim 10, wherein the control signal comprises a voltage.

17. The integrated circuit according to claim 16, wherein a relatively more positive voltage results in a higher level of gain, and a relatively more negative voltage results in a lower level of gain.

18. The integrated circuit according to claim 10, wherein the level of gain of the variable gain amplifier is determined by a variable resistance responsive to the operating mode.

19. The integrated circuit according to claim 10, further comprising:
amplitude detector circuitry for generating a signal that represents a peak output amplitude of the variable gain amplifier.

20. The integrated circuit according to claim 10, further comprising:
differencing circuitry for generating a signal representing an error of a peak output amplitude of the variable gain amplifier from a predetermined output amplitude.

21. The integrated circuit according to claim 20, further comprising:
a loop filter for filtering the signal representing an error of a peak output amplitude of the variable gain amplifier from a predetermined output amplitude.

22. A communication system having a variable gain amplifier (VGA) operable in a low gain mode and a high gain mode, wherein a level of gain when operating in one of the low gain mode and the high gain mode is adjustable according to a control signal, the system comprising:
at least one controller enabled to sense the operating mode of the variable gain amplifier, the at least one controller operable to, at least,
in the low gain mode,
compare the control signal to a first threshold representing a relatively higher level of gain, and
if a level of gain represented by the control signal is greater than the level of gain represented by the first threshold, change the operating mode of the variable gain amplifier to the high gain mode; and
in the high gain mode,
compare the control signal to a second threshold representing a relatively lower level of gain, and
if the level of gain represented by the control signal is less than the level of gain represented by the second threshold, change the operating mode of the variable gain amplifier to the low gain mode.

23. The communication system according to claim 22, wherein the at least one controller is operable in a manual or user controlled mode.

24. The communication system according to claim 23, wherein the variable gain amplifier is operable in a mid gain mode.

25. The communication system according to claim 22, wherein the second threshold represents a level of gain above which distortion is below a predetermined level.

26. The communication system according to claim 22, wherein the second threshold represents a level of gain that is available independent of variations in device fabrication process, operating voltage, and operating temperature.

27. The communication system according to claim 22, wherein the first threshold represents a level of gain slightly less than a maximum level of gain of the variable gain amplifier.

28. The communication system according to claim 22, wherein the control signal comprises a voltage.

29. The communication system according to claim 28, wherein a relatively more positive voltage results in a higher level of gain, and a relatively more negative voltage results in a lower level of gain.

30. The communication system according to claim 22, wherein gain of the variable gain amplifier is determined by a variable resistance responsive to the operating mode.

* * * * *